(12) United States Patent
Liao et al.

(10) Patent No.: US 11,433,641 B2
(45) Date of Patent: Sep. 6, 2022

(54) ELECTRONIC DEVICE CASE AND DECORATIVE FILM THEREOF

(71) Applicant: NAN YA PLASTICS CORPORATION, Taipei (TW)

(72) Inventors: Te-Chao Liao, Taipei (TW); Chun-Che Tsao, Taipei (TW); Jhen-Rong Syu, Taipei (TW)

(73) Assignee: NAN YA PLASTICS CORPORATION, Taipei (TW)

(*) Notice: Subject to any disclaimer, the term of this patent is extended or adjusted under 35 U.S.C. 154(b) by 246 days.

(21) Appl. No.: 17/008,957

(22) Filed: Sep. 1, 2020

(65) Prior Publication Data
US 2021/0127509 A1    Apr. 29, 2021

(30) Foreign Application Priority Data
Oct. 28, 2019  (TW) .................................. 108138756

(51) Int. Cl.
*B32B 7/02*    (2019.01)
*B32B 27/08*   (2006.01)

(52) U.S. Cl.
CPC ............... *B32B 7/02* (2013.01); *B32B 27/08* (2013.01); *B32B 2307/412* (2013.01); *B32B 2307/418* (2013.01)

(58) Field of Classification Search
CPC ..... B32B 7/02; B32B 27/08; B32B 2307/412; B32B 2307/418
USPC ...................................................... 428/213
See application file for complete search history.

(56) References Cited

U.S. PATENT DOCUMENTS

| 5,451,449 A | 9/1995 | Shetty et al. |
| 2004/0197574 A1 | 10/2004 | Stachowiak |
| 2006/0263554 A1* | 11/2006 | Yamada ................. B44C 1/005 428/212 |
| 2017/0254936 A1* | 9/2017 | Morita .................... B32B 37/02 |
| 2021/0127509 A1* | 4/2021 | Liao ........................ B32B 27/36 |

FOREIGN PATENT DOCUMENTS

| CN | 1509230 A | 6/2004 |
| CN | 101263003 A | 9/2008 |
| CN | 102039770 A | 5/2011 |
| CN | 103429427 A | 12/2013 |
| CN | 106405690 A | 2/2017 |

(Continued)

*Primary Examiner* — Betelhem Shewareged
(74) *Attorney, Agent, or Firm* — Li & Cai Intellectual Property (USA) Office

(57) ABSTRACT

An electronic device case and a decorative film thereof are provided. The decorative film includes a plurality of stacked optical layers. Each of the plurality of stacked optical layers includes a first optical layer, a second optical layer formed on the first optical layer, a third optical layer formed on the second optical layer, and a fourth optical layer formed on the third optical layer. The refractive indices of the first optical layer, the second optical layer, the third optical layer, and the fourth optical layer vary according to a predetermined rule, and the refractive indices of the first optical layer, the second optical layer, the third optical layer, and the fourth optical layer are all between 1.40 and 1.70. The first optical layer and the third optical layer have different refractive indices, and the second optical layer and the fourth optical layer have the same refractive index.

10 Claims, 2 Drawing Sheets

(56) References Cited

FOREIGN PATENT DOCUMENTS

| | | |
|---|---|---|
| CN | 106772708 A | 5/2017 |
| CN | 207274250 U | 4/2018 |
| CN | 108688279 A | 10/2018 |
| CN | 209065758 U | 7/2019 |
| JP | 2005324363 A | 11/2005 |
| TW | 201244928 A1 | 11/2012 |
| TW | 201711859 A | 4/2017 |
| WO | WO 0044558 A2 | 8/2000 |
| WO | 2017138828 A1 | 8/2017 |

* cited by examiner

ELECTRONIC DEVICE CASE AND DECORATIVE FILM THEREOF

CROSS-REFERENCE TO RELATED PATENT APPLICATION

This application claims the benefit of priority to Taiwan Patent Application No. 108138756, filed on Oct. 28, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a decorative film, and more particularly to an electronic device case and the decorative film thereof.

BACKGROUND OF THE DISCLOSURE

An iridescent film is a plastic film that can reflect various textures and colors from different viewing angles without adding any additional pigments or dyes.

In the conventional technology, the iridescent film is a multilayer film made up of two or more transparent thermoplastics with different light refractive indices, and by repeatedly alternating and stacking A layer/B layer/A layer/B layer or A layer/B layer/C layer/A layer/B layer/C layer to form at least 50 or more layers. When the thickness of the multilayer film reaches a certain range, the multilayer film will reflect light of a specific wavelength due to the interference of light, and according to other requirements, through different stacking thickness, the multilayer film can produce an effect similar to rainbow texture.

In the manufacturing process of the iridescent film, the key lies in the selection and structural design of resins with different refractive indices. For instance, in the conventional technology of the iridescent film, commonly used resin combinations are polymethyl methacrylate (PMMA) with polyethylene terephthalate (PET), polybutylene terephthalate (PBT), or poly(ethylene-co-1,4-cyclohexylenedimethylene terephthalate) (PETG), respectively, and the combination of polyethylene vinyl acetate (EVA) with polystyrene (PS). The iridescent film is usually designed with increasing thickness, for instance, 100 nm for the first layer/150 nm for the second layer/150 nm for the third layer/200 nm for the fourth layer. However, in the design with increasing thickness, the thickness is not easy to be controlled during actual industrial production.

Therefore, how to improve the rendering effect of the iridescent film and overcome the above-mentioned defects through the improvement of the structural design has become an important issue yet to be solved in this field.

SUMMARY OF THE DISCLOSURE

In response to the above-referenced technical inadequacies, the present disclosure provides an electronic device case and a decorative film thereof.

In one aspect, the present disclosure provides a decorative film including a plurality of stacked optical layers. Each of the plurality of stacked optical layers includes a first optical layer, a second optical layer formed on the first optical layer, a third optical layer formed on the second optical layer, and a fourth optical layer formed on the third optical layer. The refractive indices of the first optical layer, the second optical layer, the third optical layer, and the fourth optical layer vary according to a predetermined rule, and the refractive indices of the first optical layer, the second optical layer, the third optical layer, and the fourth optical layer are all between 1.40 and 1.70. The first optical layer and the third optical layer have different refractive indices, and the second optical layer and the fourth optical layer have the same refractive index.

In certain embodiments, the quantity of the plurality of stacked optical layers is more than 10 and less than or equal to 200.

In certain embodiments, the refractive index of the first optical layer is between 1.55 and 1.65, the refractive indices of the second optical layer and the fourth optical layer are between 1.48 and 1.58, and the refractive index of the third optical layer is between 1.40 and 1.48.

In certain embodiments, the material of the first optical layer is polyethylene naphthalate (PEN), the material of the second optical layer and the fourth optical layer is polymethyl methacrylate (PMMA), and the material of the third optical layer is polyethylene terephthalate (PET).

In certain embodiments, the decorative film further comprises a first surface layer and a second surface layer corresponding to each other and the plurality of stacked optical layers are disposed between the first surface layer and the second surface layer.

In certain embodiments, the materials of the first surface layer and the second surface layer are the same as the material of the first optical layer.

In certain embodiments, the thicknesses of the first optical layer, the second optical layer, the third optical layer, and the fourth optical layer are each from 10 nm to 200 nm.

In another aspect, the present disclosure provides an electronic device case including a case body and the decorative film, and the decorative film is attached to the case body.

One of the advantages of the electronic device case and the decorative film of the present disclosure is that, through the technical solution of "the refractive indices of the first optical layer, the second optical layer, the third optical layer, and the fourth optical layer vary according to a predetermined rule, and the refractive indices of the first optical layer, the second optical layer, the third optical layer, and the fourth optical layer are all between 1.40 and 1.70" and "the first optical layer and the third optical layer have different refractive indices, and the second optical layer and the fourth optical layer have the same refractive index", the color rendering effect of the decorative film is good and easy for processing, which improves the yield of the finished product to thereby reduce cost.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
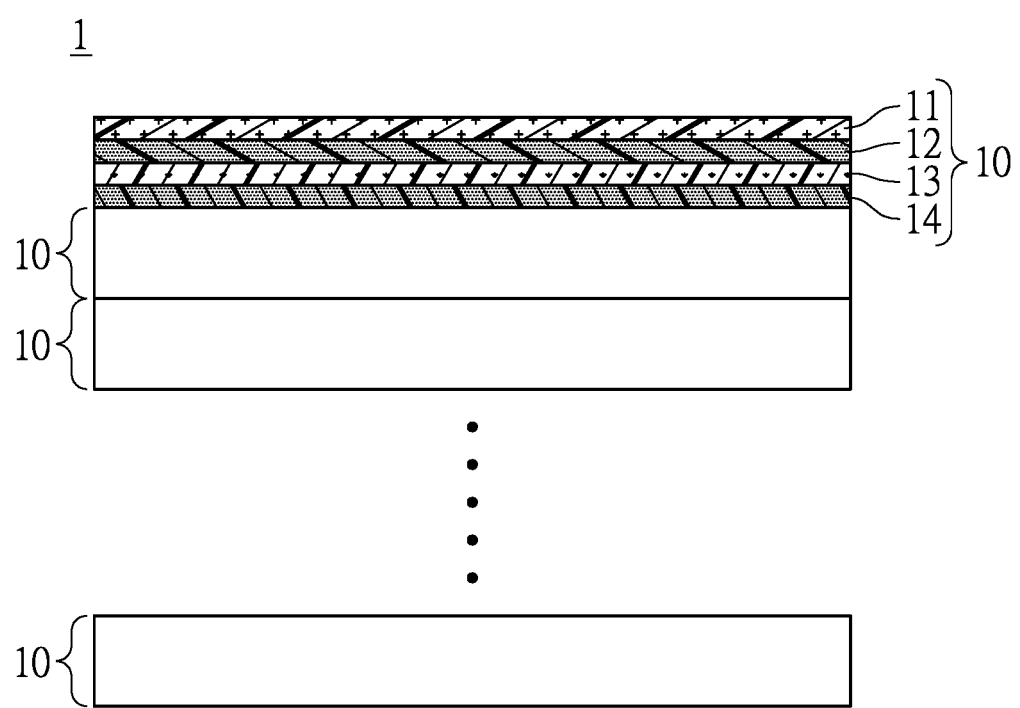
FIG. 1 is a cross-sectional view of a decorative film according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a decorative film 1 that can use optical interference to produce a colorful and rainbow-like color. The decorative film 1 includes a plurality of stacked optical layers 10 stacked together, and each of the plurality of stacked optical layers 10 functions as an optical unit. Each of the stacked optical layers 10 can be composed of a first optical layer first optical layer 11, a second optical layer second optical layer 12, a third optical layer third optical layer 13, and a fourth optical layer 14 that are sequentially stacked. It is worth mentioning that, the refractive indices of the first optical layer 11, the second optical layer 12, the third optical layer 13, and the fourth optical layer 14 vary according to a predetermined rule.

In each of the stacked optical layers 10, the second optical layer 12 is formed on the first optical layer 11, the third optical layer 13 is formed on the second optical layer 12, and the fourth optical layer 14 is formed on the third optical layer 13. The refractive indices of the first optical layer 11, the second optical layer 12, the third optical layer 13, and the fourth optical layer 14 are all between 1.40 and 1.70. The first optical layer 11, the second optical layer 12, and the third optical layer 13 have different refractive indices, and the second optical layer 12 and the fourth optical layer 14 have the same refractive index. Further, the refractive index of the first optical layer 11 is between 1.55 and 1.65, the refractive indices of the second optical layer 12 and the fourth optical layer 14 are between 1.48 and 1.58, and the refractive index of the third optical layer 13 is between 1.40 and 1.48.

In this embodiment, not only are the thickness of all the stacked optical layer 10 in the decorative film 1 the same, but the thickness of the first optical layer 11, the second optical layer 12, the third optical layer 13, and the fourth optical layer 14 in each of the optical stacked optical layer 10 are also the same. That is to say, the thickness of the first optical layer 11 of any of the optical stacked optical layers 10 is the same as the thickness of the first optical layer 11 of another one of the optical stacked optical layer 10, the thickness of the second optical layer 12 of any of the optical stacked optical layers 10 is the same as the thickness of the second optical layer 12 of another one of the optical stacked optical layer 10, the thickness of the third optical layer 13 of any of the optical stacked optical layers 10 is the same as the thickness of the third optical layer 13 of another one of the optical stacked optical layer 10, and the thickness of the fourth optical layer 14 of any of the optical stacked optical layers 10 is the same as the thickness of the fourth optical layer 14 of another one of the optical stacked optical layer 10.

It is worth mentioning that, in order to produce the expected optical effect, for instance, to achieve a refractive index of more than 80%, the total quantity of optical layers in the decorative film 1 is more than 40 layers and preferably 41 to 800 layers. In other words, the quantity of stacked optical layer 10 in the decorative film 1 needs to be 10 or more layers and preferably 11 to 200 layers. In addition, the thicknesses of the first optical layer 11, the second optical layer 12, the third optical layer 13, and the fourth optical layer 14 in each of the stacked optical layers 10 can determine the wavelength of light reflected by the decorative film 1. The thicknesses of the first optical layer 11, the second optical layer 12, the third optical layer 13, and the fourth optical layer 14 can be 10 nm to 200 nm, and the thicknesses of the first optical layer 11, the second optical layer 12, the third optical layer 13, and the fourth optical layer 14 can be the same or not. However, these details are only feasible implementations provided by this embodiment and are not intended to limit the present disclosure. In certain embodiments, when the thicknesses of the first optical layer 11, the second optical layer 12, the third optical layer 13, and the fourth optical layer 14 are 100 nm, 150 nm, 120 nm, and 170 nm respectively, the decorative film 1 can reflect green light and thus present a green appearance.

In this embodiment, the first optical layer 11 and the third optical layer 13 are both formed of polyester polymer. The specific examples of polyester polymers include polyethylene naphthalate (PEN), polycarbonate (PC), polyethylene terephthalate (PET), polybutylene terephthalate (PBT), and poly(ethylene terephthalateco-1,4-cylclohexylenedimethylene terephthalate) (PETG). The first optical layer 11 and the third optical layer 13 are formed of different polyester polymers. Preferably, the first optical layer 11 is formed of PEN, and the third optical layer 13 is formed of PET. However, these details are only feasible implementations provided by this embodiment and are not intended to limit the present disclosure.

Furthermore, the second optical layer 12 and the fourth optical layer 14 are both formed of acrylate polymers. The specific examples of acrylate polymer include polymers and copolymers of methyl acrylate, butyl acrylate, ethyl acrylate, and 2-ethylhexyl acrylate. The second optical layer 12 and the fourth optical layer 14 are formed of the same acrylate polymer. Preferably, the second optical layer 12 and the fourth optical layer 14 are formed of polymethyl methacrylate (PMMA). However, these details are only feasible implementations provided by this embodiment and are not intended to limit the present disclosure.

Moreover, each optical layer of decorative film 1 can be further added with additives such as ultraviolet absorbers, antioxidants, inorganic fillers, and colorants according to actual needs. The specific examples of ultraviolet absorbers include nickel quenchers, oxanilides, benzotriazoles, benzoic acid esters, and benzophenones. The antioxidants can include hindered phenols, amines, triazines, organophosphites, and thioesters. The inorganic filler can be selected from silicon oxide or titanium oxide. Alternatively, at least one of zirconia, alumina, aluminum hydroxide, calcium carbonate, magnesium carbonate, and barium sulfate can be added to increase the mechanical strength, moisture resistance or weather resistance of the decorative film 1. In certain embodiments, the decorative film 1 of the present disclosure can be produced by a roll-to-roll process and is suitable for large-scale and continuous production, which is beneficial for improving production efficiency and reducing production costs.

It is worth mentioning that, the conventional decorative film is formed by at least two optical layers with different refractive indices and alternately stacked in a manner of increasing thicknesses, for instance, 50 nm of A layer/50 nm of B layer/75 nm of A layer/75 nm of B layer, or 50 nm of A layer/50 nm of B layer/50 nm of C layer/75 nm of A layer/75 nm of B layer/75 nm of C layer and so on and so forth. Such a manufacturing method results in a higher processing difficulty and a lower product yield. Conversely, the decorative film 1 of the present disclosure is composed of a plurality of optical layers with the same thickness, which includes four optical layers whose thickness and refractive index change according to the predetermined rule, thereby reflecting the light of a specific wavelength and presenting a desired color appearance. Therefore, the decorative film 1 allows for simplification of the production process, improvements to the yield thereof, and reductions to the cost associated therewith.

Several representative experimental examples of the decorative film 1 of the first embodiment of the present disclosure are listed in Table 1. However, the present disclosure is not limited to the above-mentioned examples.

TABLE 1

| Items | | Experimental examples | | | | | Comparative examples | | |
|---|---|---|---|---|---|---|---|---|---|
| | | 1 | 2 | 3 | 4 | 5 | 1 | 2 | 3 |
| Material | First optical layer | PET | PET | PEN | PC | PEN | PET | PET | PEN |
| | Second optical layer | PMMA | PMMA | PMMA | PMMA | PMMA | PMMA | PET | PMMA |
| | Third optical layer | PETG | PBT | PET | PET | PET | PETG | PMMA | PET |
| | Fourth optical layer | PMMA | PMMA | PMMA | PMMA | PMMA | PMMA | PMMA | PMMA |
| Thickness | First optical layer | 100 nm | 150 nm | 80 nm | 140 nm | 100 nm | 100 nm | 80 nm | 100 nm |
| | Second optical layer | 150 nm | 170 nm | 120 nm | 160 nm | 140 nm | 100 nm | 120 nm | 140 nm |
| | Third optical layer | 120 nm | 130 nm | 120 nm | 135 nm | 100 nm | 120 nm | 120 nm | 100 nm |
| | Fourth optical layer | 170 nm | 155 nm | 150 nm | 160 nm | 125 nm | 120 nm | 150 nm | 125 nm |
| Refractive index | First optical layer | 1.58 | 1.58 | 1.64 | 1.59 | 1.64 | 1.58 | 1.58 | 1.64 |
| | Second optical layer | 1.49 | 1.49 | 1.49 | 1.49 | 1.49 | 1.49 | 1.58 | 1.49 |
| | Third optical layer | 1.57 | 1.55 | 1.58 | 1.55 | 1.58 | 1.57 | 1.49 | 1.58 |
| | Fourth optical layer | 1.49 | 1.49 | 1.49 | 1.49 | 1.49 | 1.49 | 1.49 | 1.49 |
| The quantity of the plurality of stacked optical layers | | 400 | 320 | 480 | 400 | 440 | 400 | 400 | 120 |
| Thickness of the decorative film | | 54 μm | 48.4 μm | 56.4 μm | 59.5 μm | 51.2 μm | 44 μm | 47 μm | 14.0 μm |
| Reflective index | | 80% | 82% | 85% | 81% | 87% | 15% | 3% | 22% |

Experimental Example 1

Referring to Table 1, in the decorative film of experimental example 1, the material of the first optical layer is PET, the thickness of the first optical layer is 100 nm, and the refractive index of the first optical layer is 1.58. The material of the second optical layer is PMMA, the thickness of the second optical layer is 150 nm, and the refractive index of the second optical layer is 1.49. The material of the third optical layer is PETG, the thickness of the third optical layer is 120 nm, and the refractive index of the third optical layer is 1.57. The material of the fourth optical layer is PMMA, the thickness of the fourth optical layer is 170 nm, and the refractive index of the fourth optical layer is 1.49. The second optical layer and the fourth optical layer have the same material and refractive index. In this experimental example, the quantity of stacked optical layers of the decorative film is 400, and the thickness of the decorative film is 54 μm. After testing, the refractive index of the decorative film of experimental example 1 is 80%.

Experimental Example 2

Referring to Table 1, in the decorative film of experimental example 2, the material of the first optical layer is PET, the thickness of the first optical layer is 150 nm, and the refractive index of the first optical layer is 1.58. The material of the second optical layer is PMMA, the thickness of the second optical layer is 170 nm, and the refractive index of the second optical layer is 1.49. The material of the third optical layer is PBT, the thickness of the third optical layer is 130 nm, and the refractive index of the third optical layer is 1.55. The material of the fourth optical layer is PMMA, the thickness of the fourth optical layer is 155 nm, and the refractive index of the fourth optical layer is 1.49. The second optical layer and the fourth optical layer have the same material and refractive index. In this experimental example, the quantity of stacked optical layers of the decorative film is 320, and the thickness of the decorative film is 48.4 μm. After testing, the refractive index of the decorative film of experimental example 2 is 82%.

Experimental Example 3

Referring to Table 1, in the decorative film of experimental example 3, the material of the first optical layer is PEN, the thickness of the first optical layer is 80 nm, and the refractive index of the first optical layer is 1.64. The material of the second optical layer is PMMA, the thickness of the second optical layer is 120 nm, and the refractive index of the second optical layer is 1.49. The material of the third optical layer is PET, the thickness of the third optical layer is 120 nm, and the refractive index of the third optical layer is 1.58. The material of the fourth optical layer is PMMA, the thickness of the fourth optical layer is 150 nm, and the refractive index of the fourth optical layer is 1.49. The second optical layer and the fourth optical layer have the same material and refractive index. In this experimental example, the quantity of stacked optical layers of the decorative film is 480, and the thickness of the decorative film is 56.4 μm. After testing, the refractive index of the decorative film of experimental example 3 is 85%.

Experimental Example 4

Referring to Table 1, in the decorative film of experimental example 4, the material of the first optical layer is PC, the thickness of the first optical layer is 140 nm, and the refractive index of the first optical layer is 1.59. The material of the second optical layer is PMMA, the thickness of the second optical layer is 160 nm, and the refractive index of the second optical layer is 1.49. The material of the third optical layer is PET, the thickness of the third optical layer is 135 nm, and the refractive index of the third optical layer is 1.55. The material of the fourth optical layer is PMMA, the thickness of the fourth optical layer is 160 nm, and the refractive index of the fourth optical layer is 1.49. The second optical layer and the fourth optical layer have the same material and refractive index. In this experimental example, the quantity of stacked optical layers of the decorative film is 400, and the thickness of the decorative film is 59.5 μm. After testing, the refractive index of the decorative film of experimental example 4 is 81%.

Experimental Example 5

Referring to Table 1, in the decorative film of experimental example 5, the material of the first optical layer is PEN, the thickness of the first optical layer is 100 nm, and the refractive index of the first optical layer is 1.64. The material of the second optical layer is PMMA, the thickness of the second optical layer is 140 nm, and the refractive index of the second optical layer is 1.49. The material of the third optical layer is PET, the thickness of the third optical layer is 100 nm, and the refractive index of the third optical layer is 1.57. The material of the fourth optical layer is PMMA, the thickness of the fourth optical layer is 125 nm, and the refractive index of the fourth optical layer is 1.49. The second optical layer and the fourth optical layer have the same material and refractive index. In this experimental example, the quantity of stacked optical layers of the decorative film is 440, and the thickness of the decorative film is 51.2 μm. After testing, the refractive index of the decorative film of experimental example 5 is 87%.

Comparative Example 1

Referring to Table 1, in the decorative film of comparative example 1, the material of the first optical layer is PET, the thickness of the first optical layer is 100 nm, and the refractive index of the first optical layer is 1.58. The material of the second optical layer is PMMA, the thickness of the second optical layer is 100 nm, and the refractive index of the second optical layer is 1.49. The material of the third optical layer is PETG, the thickness of the third optical layer is 120 nm, and the refractive index of the third optical layer is 1.57. The material of the fourth optical layer is PMMA, the thickness of the fourth optical layer is 120 nm, and the refractive index of the fourth optical layer is 1.49. The second optical layer and the fourth optical layer have the same material and refractive index. In this comparative example, the quantity of stacked optical layers of the decorative film is 400, and the thickness of the decorative film is 44 μm. After testing, the refractive index of the decorative film of comparative example 1 is 15%. Compared to experimental examples 1 to 5, the refractive index of the decorative film of comparative example 1 is significantly lower.

Comparative Example 2

Referring to Table 1, in the decorative film of comparative example 2, the material of the first optical layer is PET, the thickness of the first optical layer is 80 nm, and the refractive index of the first optical layer is 1.58. The material of the second optical layer is PET, the thickness of the second optical layer is 120 nm, and the refractive index of the second optical layer is 1.58. The material of the third optical layer is PMMA, the thickness of the third optical layer is 120 nm, and the refractive index of the third optical layer is 1.49. The material of the fourth optical layer is PMMA, the thickness of the fourth optical layer is 150 nm, and the refractive index of the fourth optical layer is 1.49. The first optical layer and the second optical layer have the same material and refractive index, and the third optical layer and the fourth optical layer have the same material and refractive index. In this comparative example, the quantity of stacked optical layers of the decorative film is 400, and the thickness of the decorative film is 47 μm. After testing, the refractive index of the decorative film of comparative example 2 is 3%. Compared to experimental examples 1 to 5, the refractive index of the decorative film of comparative example 2 is significantly lower.

Comparative Example 3

Referring to Table 1, in the decorative film of comparative example 3, the material of the first optical layer is PEN, the thickness of the first optical layer is 100 nm, and the refractive index of the first optical layer is 1.64. The material of the second optical layer is PMMA, the thickness of the second optical layer is 140 nm, and the refractive index of the second optical layer is 1.49. The material of the third optical layer is PET, the thickness of the third optical layer is 100 nm, and the refractive index of the third optical layer is 1.58. The material of the fourth optical layer is PMMA, the thickness of the fourth optical layer is 125 nm, and the refractive index of the fourth optical layer is 1.49. The second optical layer and the fourth optical layer have the same material and refractive index. In this comparative example, the quantity of stacked optical layers of the decorative film is 120, and the thickness of the decorative film is 14 μm. After testing, the refractive index of the decorative film of comparative example 3 is 22%. Compared to experimental examples 1 to 5, the refractive index of the decorative film of comparative example 3 is significantly lower.

Second Embodiment

Figure 2:
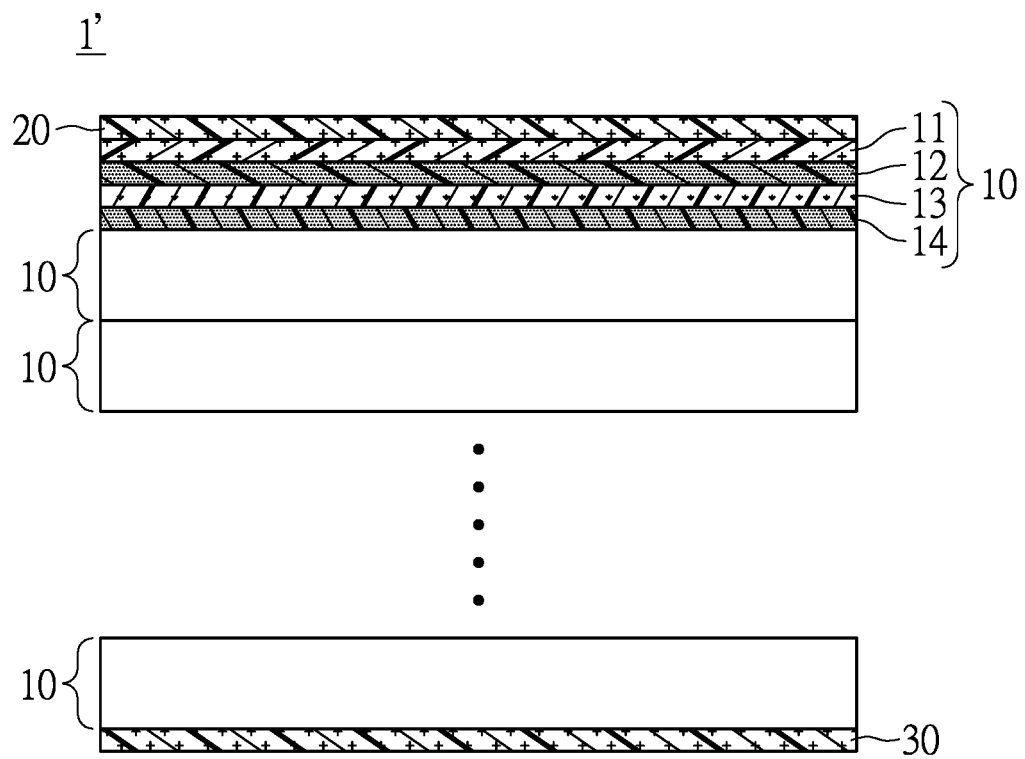
FIG. 2 is a cross-sectional view of a decorative film according to a second embodiment of the present disclosure.

Referring to FIG. 2, a second embodiment of the present disclosure provides a decorative film 1' including a plurality of stacked optical layers 10, a first surface layer 20, and a second surface layer 30, each of the stacked optical layers 10 functions as an optical unit, and the plurality of stacked optical layers 10 are disposed between the first surface layer 20 and the second surface layer 30. Each of the stacked optical layers 10 can be composed of a first optical layer 11, a second optical layer 12, a third optical layer 13, and a fourth optical layer 14 that are sequentially stacked. The refractive indices of the first optical layer 11, the second optical layer 12, the third optical layer 13, and the fourth optical layer 14 vary according to a predetermined rule.

In each of the stacked optical layers 10, the second optical layer 12 is formed on the first optical layer 11, the third optical layer 13 is formed on the second optical layer 12, and the fourth optical layer 14 is formed on the third optical layer 13. The refractive indices of the first optical layer 11, the second optical layer 12, the third optical layer 13, and the fourth optical layer 14 are all between 1.40 and 1.70. The first optical layer 11, the second optical layer 12, and the third optical layer 13 have different refractive indices, and the second optical layer 12 and the fourth optical layer 14 have the same refractive index. Further, the refractive index of the first optical layer 11 is between 1.55 and 1.65, the refractive indices of the second optical layer 12 and fourth optical layer 14 are between 1.48 and 1.58, and refractive index of the third optical layer 13 is between 1.40 and 1.48.

It is worth mentioning that, the first surface layer 20, the second surface layer 30, and the first optical layer 11 are formed of the same material which can be a polyester copolymer, preferably PEN. Since the plurality of stacked optical layers 10 are disposed between the first surface layer 20 and the second surface layer 30, the first surface layer 20 and the second surface layer 30 are capable of protecting the plurality of stacked optical layers 10 against external impact or dirt.

Third Embodiment

Figure 3:
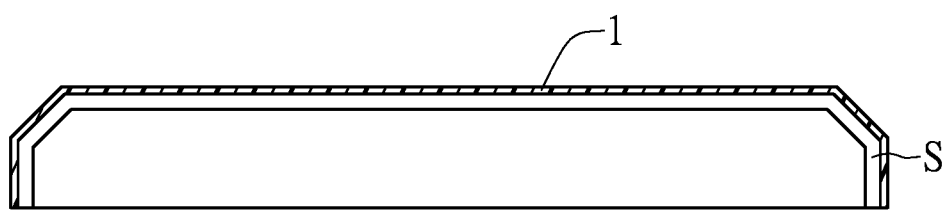
FIG. 3 is a cross-sectional view of an electronic device case according to a third embodiment of the present disclosure.

Referring to FIG. 3, a third embodiment of the present disclosure provides an electronic device case C, which includes a case body S and the decorative film 1 of the present disclosure. In addition, the decorative film 1 is attached to the case body S. In this embodiment, the electronic device case C is a mobile phone case, which can achieve a color change by changes of light and viewing angle through the decorative film 1. However, these details are only feasible implementations provided by this embodiment and are not intended to limit the present disclosure.

Advantages of the Embodiments

One of the advantages of the electronic device case and the decorative film of the present disclosure is that, through the technical solution of "the refractive indices of the first optical layer, the second optical layer, the third optical layer, and the fourth optical layer vary according to a predetermined rule, and the refractive indices of the first optical layer, the second optical layer, the third optical layer, and the fourth optical layer are all between 1.40 and 1.70" and "the first optical layer and the third optical layer have different refractive indices, and the second optical layer and the fourth optical layer have the same refractive index", the color rendering effect of the decorative film is good and easy for processing, which improves the yield of the finished product to thereby reduce cost.

Furthermore, by having the same thicknesses, the plurality of stacked optical layers in the decorative film can effectively improve the simplicity of the manufacturing process and the yield of the product.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A decorative film, which comprises a plurality of stacked optical layers stacked together, and each of the stacked optical layers comprising:
   a first optical layer;
   a second optical layer formed on the first optical layer;
   a third optical layer formed on the second optical layer; and
   a fourth optical layer formed on the third optical layer;
   wherein refractive indices of the first optical layer, the second optical layer, the third optical layer, and the fourth optical layer vary according to a predetermined rule, and the refractive indices of the first optical layer, the second optical layer, the third optical layer, and the fourth optical layer are between 1.40 and 1.70;
   wherein the first optical layer, the second optical layer, and the third optical layer have different refractive indices, and the second optical layer and the fourth optical layer have the same refractive index.

2. The decorative film according to claim 1, wherein the quantity of the plurality of stacked optical layers is more than 10 and less than or equal to 200.

3. The decorative film according to claim 2, wherein the refractive index of the first optical layer is between 1.55 and 1.65, the refractive indices of the second optical layer and fourth optical layer are between 1.48 and 1.58, and the refractive index of the third optical layer is between 1.40 and 1.48.

4. The decorative film according to claim 3, wherein the thicknesses of the first optical layer, the second optical layer, the third optical layer, and the fourth optical layer are each from 10 nm to 200 nm.

5. The decorative film according to claim 4, wherein the decorative film further comprises a first surface layer and a second surface layer corresponding to each other and the plurality of stacked optical layers are disposed between the first surface layer and the second surface layer.

6. The decorative film according to claim 2, wherein the material of the first optical layer is polyethylene naphthalate, the material of the second optical layer and fourth optical layer is polymethyl methacrylate, and the material of the third optical layer is polyethylene terephthalate.

7. The decorative film according to claim 6, wherein the thicknesses of the first optical layer, the second optical layer, the third optical layer, and the fourth optical layer are each from 10 nm to 200 nm.

8. The decorative film according to claim 7, wherein the decorative film further comprises a first surface layer and a second surface layer corresponding to each other and the plurality of stacked optical layers are disposed between the first surface layer and the second surface layer.

9. The decorative film according to claim 8, wherein the materials of the first surface layer and the second surface layer are the same as the material of the first optical layer.

10. An electronic device case comprising a case body and the decorative film as claimed in claim 1, wherein the decorative film is attached to the case body.

* * * * *